(12) United States Patent  
Nguyen et al.

(10) Patent No.: US 8,233,332 B2
(45) Date of Patent: Jul. 31, 2012

(54) METHODS AND APPARATUS FOR STROBE SIGNALING AND EDGE DETECTION THEREOF

(75) Inventors: Huy M. Nguyen, San Jose, CA (US); Vijay Gadde, Cupertino, CA (US); Bret G. Stott, Menlo Park, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 13/016,904

(22) Filed: Jan. 28, 2011

(65) Prior Publication Data

US 2011/0249514 A1 Oct. 13, 2011

Related U.S. Application Data

(63) Continuation of application No. 12/220,454, filed on Jul. 24, 2008, now Pat. No. 7,898,878.

(60) Provisional application No. 60/962,997, filed on Aug. 2, 2007.

(51) Int. Cl.
*G11C 11/00* (2006.01)

(52) U.S. Cl. ............................. 365/189.07; 365/230.06

(58) Field of Classification Search ............. 365/189.07, 365/193, 230.06
See application file for complete search history.

(56) References Cited

U.S. PATENT DOCUMENTS

| | | | | |
|---|---|---|---|---|
| 5,619,456 A | * | 4/1997 | McClure | 365/189.17 |
| 6,401,213 B1 | * | 6/2002 | Jeddeloh | 713/401 |
| 6,480,946 B1 | * | 11/2002 | Tomishima et al. | 711/167 |
| 6,493,285 B1 | * | 12/2002 | Wolford | 365/185.17 |
| 2007/0047337 A1 | * | 3/2007 | Iizuka | 365/193 |

* cited by examiner

*Primary Examiner* — Michael Tran
(74) *Attorney, Agent, or Firm* — Mahamedi Paradice Kreisman LLP; Lance M. Kreisman

(57) ABSTRACT

A data system component having a state machine circuit and receivers that utilize high and low threshold signals permits accurate detection of strobe signal pattern edges such as those for preamble, burst and post-amble conditions in the strobe signal. The state machine circuit may then be configured to set conditions associated with further circuit elements such as for power saving, data reception, on-die termination, etc. based on the conditions detected in the strobe signal to improve data or memory system performance. The components may be implemented as part of memory controllers and/or memory such as a dynamic random access memory and used in memory read and write operations.

18 Claims, 6 Drawing Sheets

METHODS AND APPARATUS FOR STROBE SIGNALING AND EDGE DETECTION THEREOF

CROSS-REFERENCE TO RELATED APPLICATIONS

This application is a continuation of U.S. application Ser. No. 12/220,454, filed Jul. 24, 2008, entitled "Methods and Apparatus For Strobe Signaling and Edge Detection Thereof", issued as U.S. Pat. No. 7,898,878; which claims benefit of priority to U.S. Provisional Application No. 60/962,997, filed Aug. 2, 2007, entitled "Methods and Apparatus For Strobe Signaling and Edge Detection Thereof,"; the aforementioned applications being hereby incorporated by reference in their entirety.

BACKGROUND

Computing, communications, consumer electronics and other processor-based systems are driven to host a larger number of applications, each with increasing complexity. The transfer of information and signals required among the components of these processor-based systems leads to increasing performance demands on the circuit devices involved in transfer of data. For example, memory system speeds and capacity may be increased to satisfy a demand for more applications.

An example of a memory type that can be used with these systems is a double-data rate synchronous dynamic random access memory (e.g., the DDR-SDRAM family of products, which includes products of all DDR generations, including DDR1, DDR2, DDR3, DDR4, etc.). The DRAM is considered synchronous as it coordinates its operations to a provided clock signal, and it is considered double-data rate as it transfers data on both the rising and falling edge of the clock.

DDR DRAM devices may transmit and receive data using a strobe-based method. In this method, a strobe signal (which may be referred to as a DQS signal in a DDR system but may be referred to by other acronyms in other types of systems) is edge-aligned to and accompanies a group of data signals (which may be referred to as the DQ signals) sent by the DRAM in a "read" operation. Also in this method, a strobe signal (DQS) is center-aligned (also referred to as "quadrature aligned" since DQS is offset from the data edge by a quarter of the clock cycle time) to and accompanies the data signals (DQ signals) in a "write" operation. The DQS signals are then used by the receiving devices to time the sampling of the data signal. For example, in the memory controller (which is the receiving device during memory read operations), the DQS signal and the data are received and the DQS signal is delayed by some fixed amount, nominally one-fourth of the memory system clock period. This delayed DQS signal, which is now approximately in quadrature with the received data, is then used as a common sample clock for each of the DQ input receivers for a particular number of bits of data associated with the strobe signal.

BRIEF DESCRIPTION OF DRAWINGS

The present technology is illustrated by way of example, and not by way of limitation, in the figures of the accompanying drawings, in which like reference numerals refer to similar elements including.

DETAILED DESCRIPTION

Figure 1:
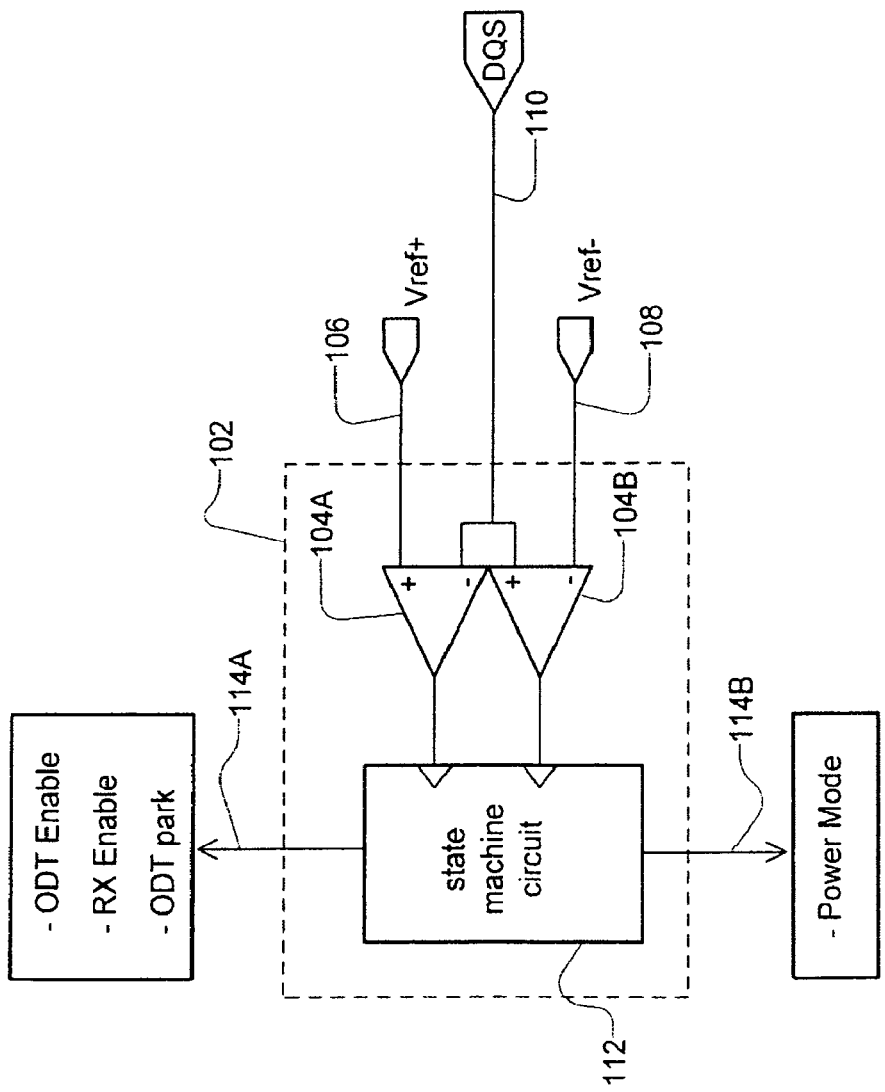
FIG. 1 is diagram having example circuit components suitable for implementing the present strobe signal edge detection technology.

FIG. 1 illustrates an apparatus suitable for implementing the present strobe detection technology. The embodiment of FIG. 1 generally includes a strobe signal detector 102. The strobe signal detector will typically be part of a data system, such as a system that transmits data on a signal bus between circuit components. For example, the strobe signal detector 102 may be implemented in a system that transfers data between a memory controller and memory. The strobe signal detector may be formed as part of an integrated circuit chip with circuits of a memory controller or memory and participate in read and write data transmission operations across a signal bus utilizing a strobe-based method such as the one previously discussed. However, detectors may be formed on additional integrated circuit chips separate from controller and memory chips but may be coupled with them for the operational purposes as discussed in more detail herein. Merely by way of example, the circuits may form parts of a single computer system or other electronic or processing device.

The strobe signal detector 102 will typically have receivers 104A and 104B. In this embodiment, the receivers 104A, 104B can be implemented by devices for comparing a received signal with a threshold signal. For example, the receivers 104A and 104B may be implemented by a window comparator. Thus, in a data system which uses voltage signaling across a signal bus to which the receivers 104A and 104B are coupled, the receivers may be implemented using a pair of voltage comparators. The window comparator may be configured for comparing a received timing signal or strobe signal 110 received from a signal bus with threshold signals such as a high reference voltage (Vref+) signal and low reference voltage (Vref−) signal from reference pins, inputs or contact pads. As shown in the example of FIG. 1, receiver 104A receives strobe signal 110, which may be from a DQS pin, input or contact pad connectable with a signal bus and compares the signal with a high threshold signal 106 (e.g., Vref+). Similarly, receiver 104B receives strobe signal 110, which may be from the DQS pin, input or contact pad and compares the signal with a low threshold signal 108 (e.g., Vref−). Based on continuous or periodic comparisons with the high and low threshold signals, the output signals of the receivers 104A and 104B are indicative of whether the strobe signal 110 is high or low. Thus, receiver 104A may output a high (e.g., a digital "1") signal if the strobe signal exceeds a high threshold signal and low (e.g., a digital "0") if it is below the high threshold signal. Moreover, receiver 104B may output a high signal (e.g., a digital "1") if the strobe signal falls below the low threshold signal and a low (e.g., a digital "0") signal if it is not below the low threshold signal.

Given a system utilizing a timing signal or strobe signal 110 that has an idle state at a nominal signal level, such as a nominal voltage signal (Vref), that is between the high and low levels of the strobe signal that may be relied on for synchronization of data operations, using the high threshold signal 106 (Vref+) in conjunction with a low threshold signal 108 (Vref−) permits accurate determination of the high and low states of the strobe signal 110. Moreover, this can permit a determination of the type of edge (rising or falling) associated with the rising or falling strobe signal transitions. Thus, it will be understood that the actual values of the high threshold signal 106 (Vref+) and the low threshold signal 108 (Vref−), while offset relative to the nominal level (e.g., Vref), can be determined based on the signal characteristics of the particular data system in which the strobe signal detector 102 may be implemented. However, these levels may also be offset from maximum or minimum timing signal or strobe signal levels, in addition to the nominal level, to permit a reliable detection of the conditions or patterns of the timing or signal.

The output comparison signals of the receivers 104A and 104B may then be input to a state machine circuit 112 for detecting patterns of the strobe signal 110 based on the comparing implemented in the receivers. By utilizing a periodic or continuous logical combination of the two output signals as input signals to a collection of logic gates that implement stored states, the state machine circuit 112 can accurately detect changing patterns in the strobe signal, such as idle, preamble, burst, and/or post-amble conditions as will be described in more detail herein. Moreover, the circuit may accurately detect the initial and/or terminating edges of these strobe signal conditions.

The strobe detector output signals 114A and 114B resulting from the logic of the state machine circuit 112 may then be utilized to change settings of associated system circuits based on the conditions or patterns detected in the strobe signal 110. For example, the one or more output signals 114A of the state machine circuit 112 may enable one or more data receivers for data reception, such as in response to the detection of a preamble state and/or burst state in a strobe signal 110. Similarly, the one or more output signals 114A of the state machine circuit 112 may disable one or more data receivers for an idle mode of the data receivers, such as in response to the detection of a post-amble state and/or idle state of a strobe signal 110. Furthermore, one or more output signals 114A of the state machine circuit 112 may enable, disable or set (e.g., park) certain on-die termination (ODT) circuitry utilized during data transmissions to reduce data transmission signal refection based on the conditions of the strobe signal by changing the signal bus channel impedance. For example, the one or more output signals 114A of the state machine circuit 112 may enable or set certain ODT circuitry for certain channels of the signal bus for data transmissions associated with a particular strobe signal upon detection of a preamble and/or burst states of the strobe signal. The ODT circuitry may similarly be disabled or set for the absence of signal bus data transmissions upon detection of post-amble and/or idle states in the strobe signal 110. Similarly, one or more output signals 114B may be utilized to enable or set power saving circuitry. For example, voltage levels for idle components of the data system may be reduced to power saving levels upon detection of idle or post-amble states in the strobe signal. Alternatively, voltage levels for such data system components may be increased to operational levels upon detection of preamble or burst states. Other suitable adjustments may also be made based on the detected states of the strobe signal utilizing the state machine circuit 112 of the strobe signal detector 102.

Figure 2:
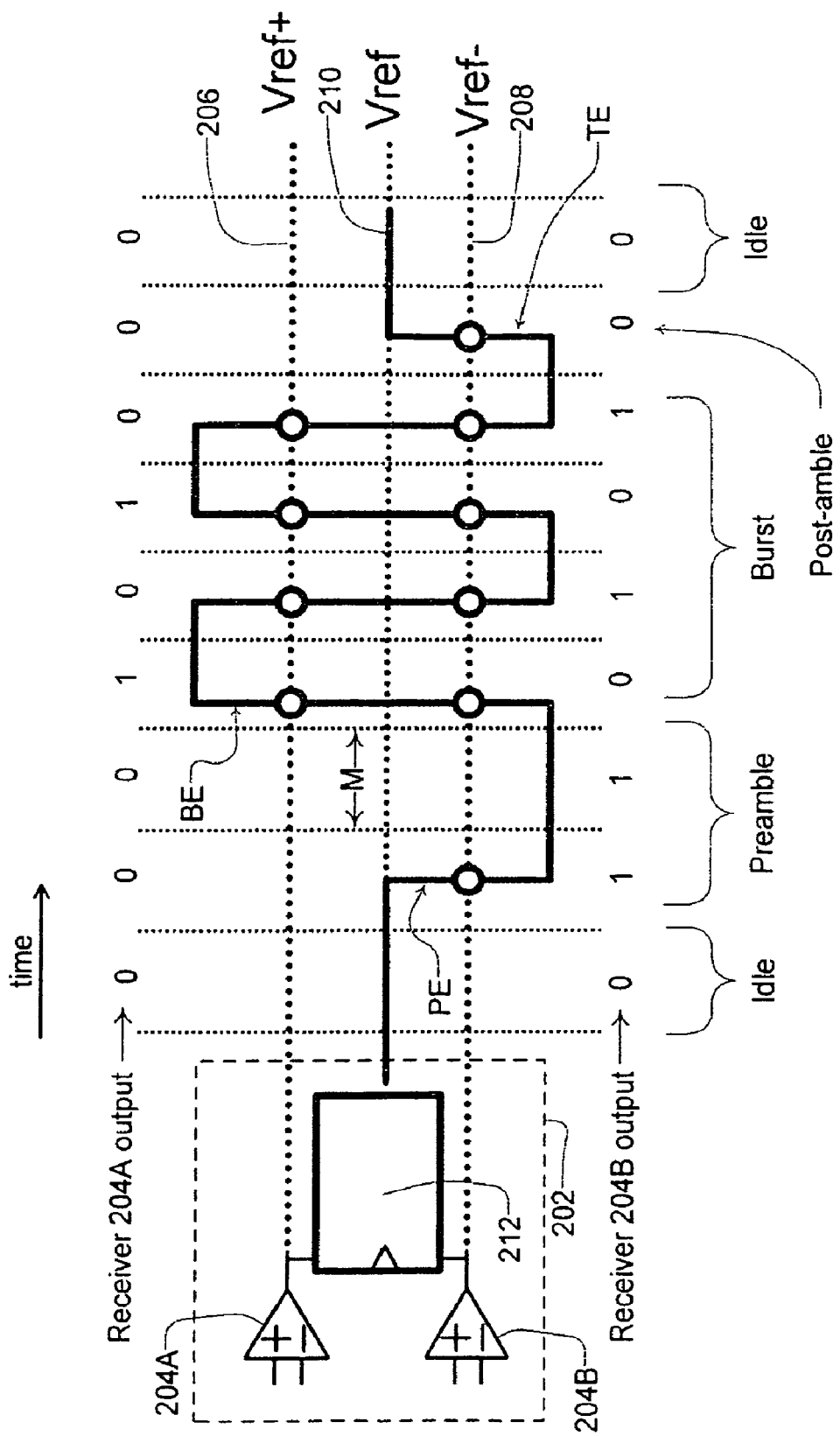
FIG. 2 is a diagram illustrating patterns that may be detected from a strobe signal utilizing a strobe signal detector of the present technology.

FIG. 2 shows example patterns that may be detected from a timing signal or strobe signal 210 with an embodiment of the strobe signal detector 202 of the present technology. In FIG. 2, the strobe signal 210 may be transmitted with a pattern to represent an idle state, preamble state, burst state and post-amble state. The states of the strobe signal 210 are further illustrated with respect to suitable high threshold signal 206 and low threshold signals 208. In this embodiment, the idle state is indicated by low outputs ("0" and "0") from the outputs of the receivers 204A and 204B in relation to a comparison of the strobe signal 210 with the high threshold signal 206 and the low threshold signal 208. This idle condition is utilized to indicate that no data is being transmitted from a data transmission circuit associated with the circuit that generates the strobe signal. As the strobe signal 210 falls below the low threshold signal, a first preamble edge PE of a preamble state is detected by low and high outputs ("0" and "1") respectively from the outputs of the receivers 204A and 204B. As the level of the strobe signal 210 remains below the low threshold signal 208 for an arbitrarily selected period of time M, such as, at least one half of the cycle time, the preamble state is detected. This condition indicates that a data transmission is about to begin. This may be detected by subsequent low and high outputs ("0" and "1") respectively from the output of the receivers 204A and 204B.

Following the preamble state, as the strobe signal rises above the low threshold signal 208 to exceed the high threshold signal 206, a first burst edge BE of a burst state is detected. This condition indicates that a data transmission is in progress. For example, the data in an associated data signal may be synchronously aligned (or offset) with respect to the edges of the strobe signal. This state of the strobe signal can be detected by subsequent high and low outputs ("1" and "0") respectively from the outputs of the receivers 204A and 204B. The burst state may continue for an arbitrary number of oscillations of the strobe signal depending on the quantity of data that is being transmitted in any data signal that is associated with the strobe signal. This further condition of the strobe signal may be detected by subsequent alternating high and low outputs ("1" and "0") and low and high ("0" and "1") respectively from the outputs of the receivers 204A and 204B. Finally, a post-amble state may be detected by a subsequent return to the nominal level (e.g., Vref) by the strobe signal 210. In this case, the terminating edge TE of the post-amble state of the strobe signal may be detected from subsequent low outputs ("0" and "0") respectively from the outputs of the receivers 204A and 204B. This post-amble condition indicates that the prior data transmission is complete.

Figure 3:
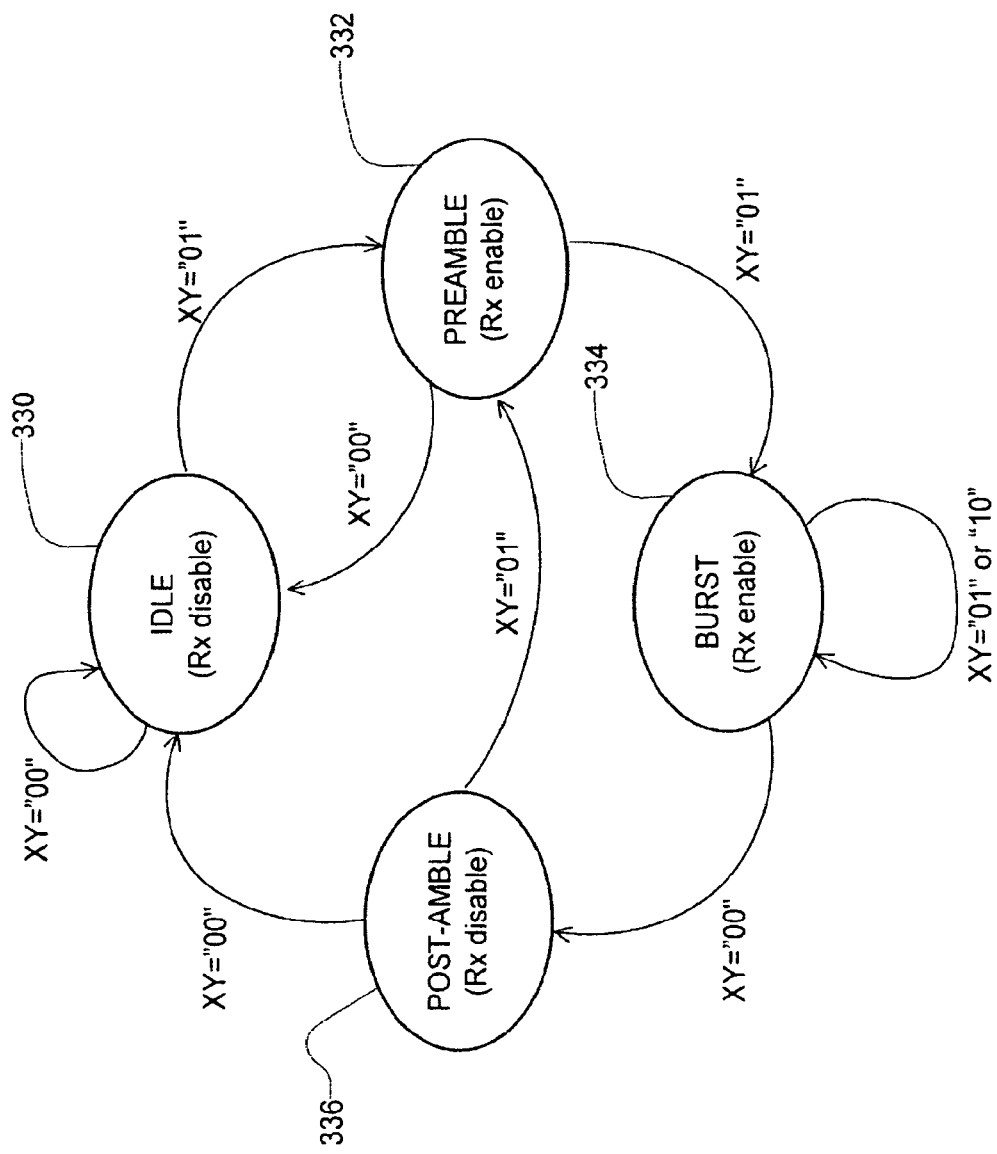
FIG. 3 is an example state diagram that may be implemented in an embodiment of a strobe signal detector of the present technology.

FIG. 3 is an example state diagram that may be implemented by a state machine circuit 112 of FIG. 1 suitable for use in an embodiment of a strobe detector of the present technology. In the illustrative diagram, the output of the state machine circuit 112 is shown with respect to a data receiver enable signal (e.g., Rx enable and Rx disable). However, it will be recognized that other output signals as previously discussed may be implemented with the various internal states indicated by the diagram. The input "XY" to the state machine circuit 112 that is illustrated in the diagram of FIG. 3 corresponds respectively to the output of the comparisons performed by receivers 104A and 104B. Thus, the "X" bit is associated with the comparison of the strobe signal 110 with the high threshold signal 106 and the "Y" bit is associated with the comparison of the strobe signal 110 with the low threshold signal 108.

In FIG. 3, the first state may be the idle state 330. In this idle state 330, the output may disable data receivers by setting a data receiver enable signal low (e.g., RX_Enable=0). In this state, ODT circuits may optionally be disabled by an ODT disable signal (not shown) output by the state machine circuit 112 or the strobe signal detector. Based on comparison inputs of "00", the state machine circuit 112 will remain in the idle state 330. However, upon a comparison input of "01", the device may advance to the preamble state 332.

In this preamble state 332, the output may enable data receivers by setting a data receiver enable signal high (e.g., RX_Enable=1). In this state, ODT circuits may optionally be enabled by an ODT enable signal (not shown) output by the state machine circuit 112 or the strobe signal detector. Based on comparison input of "00", the state machine circuit 112 may return to the idle state 330. However, from preamble state 332, in the presence of comparison input of "01", the device may advance to the burst state 334.

From the burst state 334, the state machine circuit 112 output may enable data receivers (or continue to enable them) by setting a data receiver enable signal high (e.g., RX_Enable=1). Based on comparison input of "01" or "10", the state machine circuit 112 may remain in the burst state 334. However, from the burst state 334, upon comparison input of "00" the device will advance to the post-amble state 336.

In the post-amble state 336, the output may disable data receivers by setting a data receiver enable signal low (e.g., RX_Enable=0). Based on a further comparison input of "00" the state machine circuit 112 may return to the idle state 330. Alternatively, based on a further comparison input of "01" the state machine circuit 112 may return to the preamble state 332.

Figure 4:
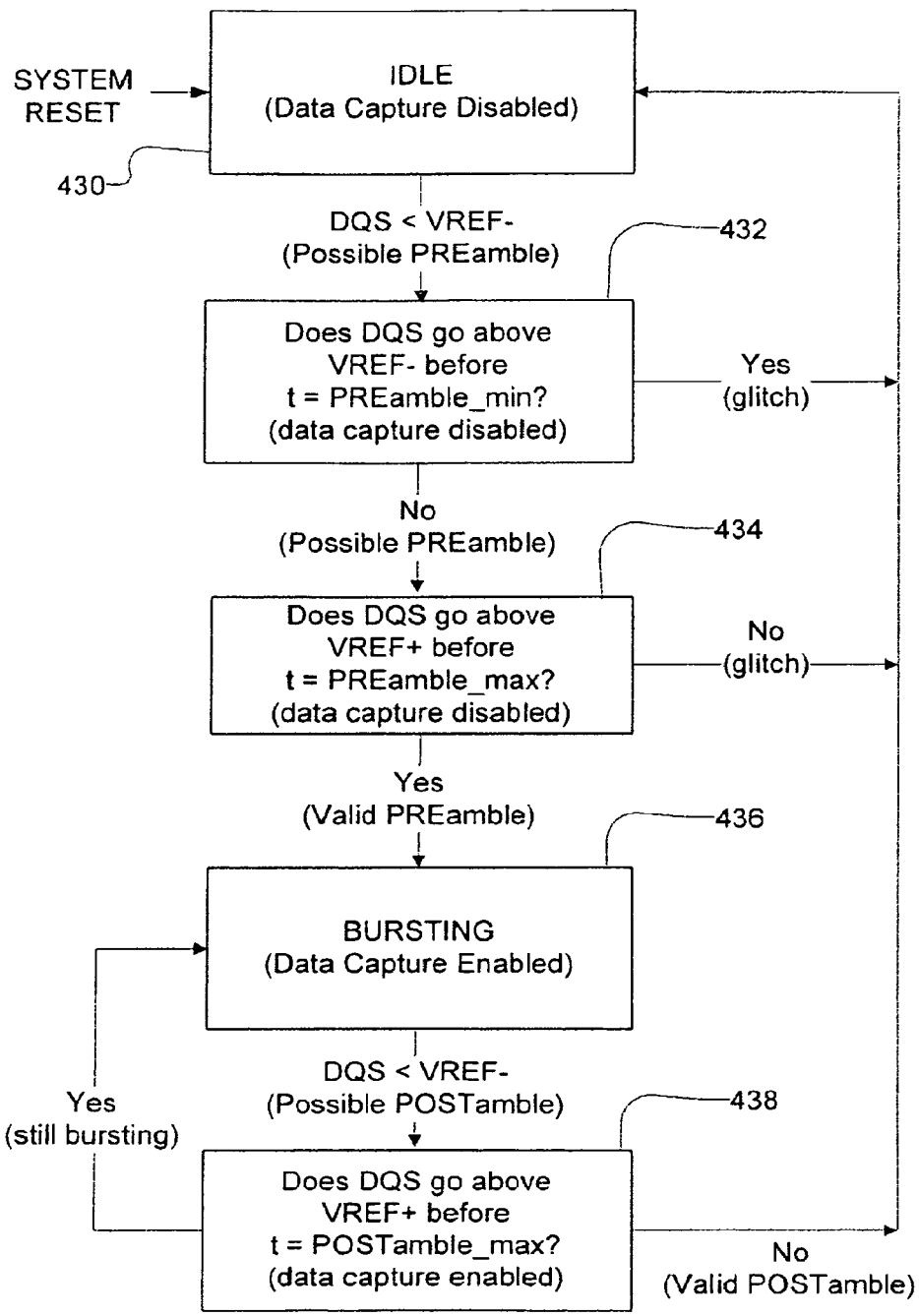
FIG. 4 is an example flow diagram that may be implemented in an embodiment of a strobe signal detector of the present technology.

A strobe signal detector 102 may further avoid erroneous strobe pattern detection by implementing a strobe detection method as illustrated in the flow chart of FIG. 4. At 430, after being reset, the system will be in an idle state. In this state, data capture may be disabled. If the strobe signal (e.g., DQS) is less than the low threshold signal (e.g., VREF−) then a possible preamble condition is occurring. At 432, data capture remains disabled. If the strobe signal (e.g., DQS) subsequently exceeds the low threshold signal (e.g., VREF−) before some predetermined time (t), such as a minimum time, has elapsed then a glitch or error has occurred and no preamble has occurred. In this event, the system will return to the idle state at 430. If this event does not occur, then a possible preamble is still in effect. Data capture then remains disabled at 434.

At 434, if the strobe signal (e.g., DQS) exceeds the high threshold (e.g., VREF+) before some predetermined time (t), such as a maximum time, then a valid preamble is detected and flow passes to 436. However, if it does not, a glitch or error has occurred and the system returns to the idle state of 430. At 436, the system is in a detected burst state during which time data capture will be enabled by the strobe signal detector. From 436, if the strobe signal (e.g., DQS) is less than the low threshold signal (e.g., VREF−) then a possible post-amble condition is occurring. Thus, passing to 438 while data capture remains enabled, if the strobe signal (e.g., DQS) exceeds the high threshold signal (e.g., VREF+) before some predetermined time (t), such as a maximum time, then the system is still in the detected burst state and flow returns to 436. However, if the strobe signal (DQS) does not, then a valid post-amble signal has been detected and system flow returns to 430.

Figure 5:
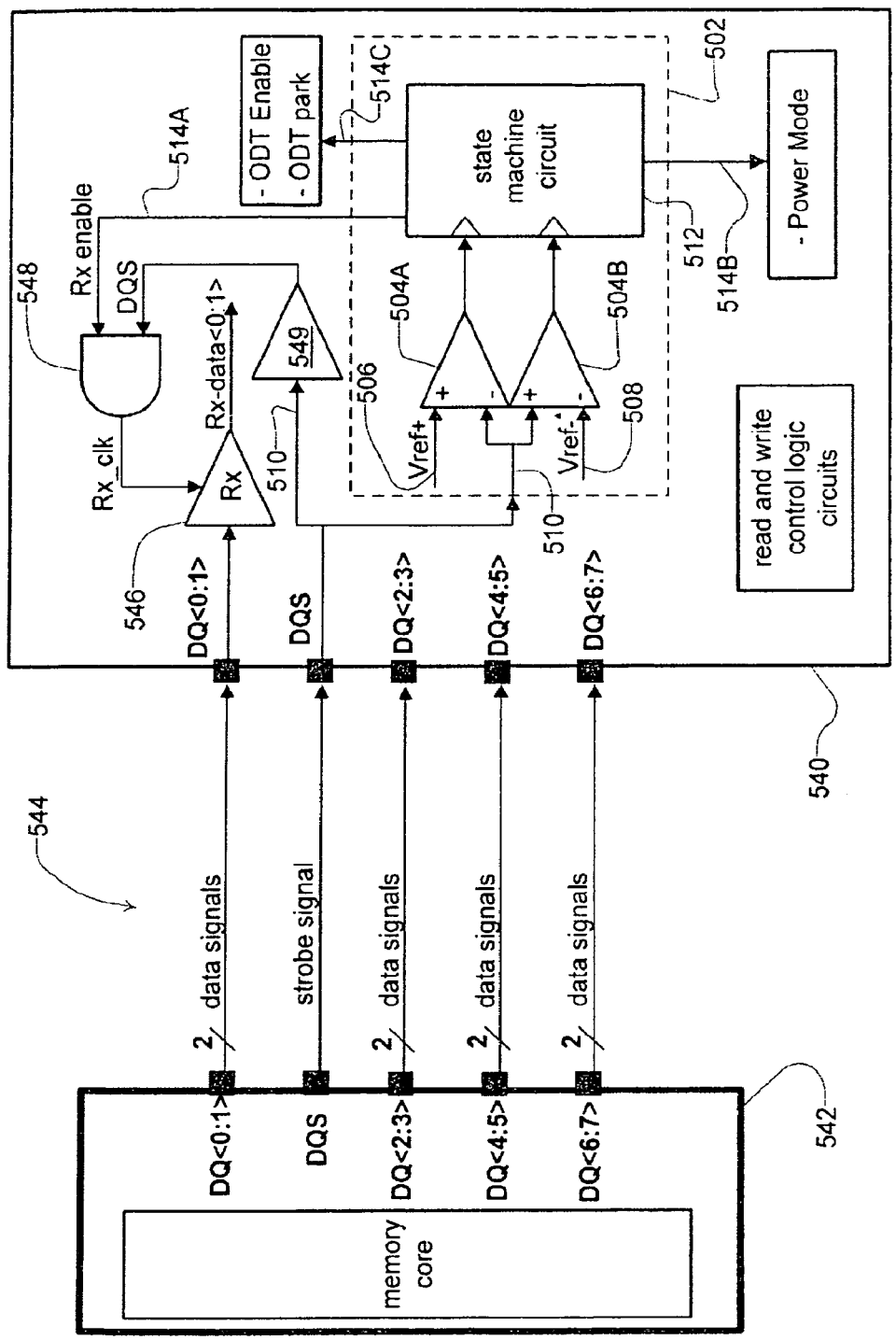
FIG. 5 shows an example strobe detector implemented in a data system having a memory controller and memory.

An embodiment of a strobe signal detector 502 as implemented in an example data system is shown in FIG. 5. The strobe signal detector 502 is shown as part of a memory controller 540 but may also, or alternatively, be implemented in or with the memory 542 component. As previously mentioned, the memory 542 and memory controller 540 may be implemented as parts of a single computer system or other electronic device, and may be disposed in proximity to one another as, for example, within about 10 meters of one another, and the signal bus may be less than about 10 meters long. In such a system, the data and strobe signals will be sent as baseband signals, that is, they will not be modulated on a carrier frequency.

The memory controller 540 controls a transmission or transfer of data signals to and from the memory 542 in read and write operations via signal bus 544 that is connected with the DQ terminals of both the memory 542 and the memory controller 540. As previously discussed, the read and write operations can be based on one or more strobe signals transferred between the devices on the signal bus 544. For example, a strobe signal may be transferred on the bus via the strobe signal terminal DQS of the memory 542 and the memory controller 540. The signal bus 544 may include elements commonly used for transmission of signals between chips as, for example, wires or conductors on a circuit panel and may be implemented as a multi-drop bus or a point-to-point bus. The memory 542 may be, for example, a random access memory and/or double data rate memory such as a double-data rate synchronous dynamic random access memory (DDR-SDRAM). The system may also be implemented with more than one memory 542 such as a plurality of double data rate synchronous dynamic random access memories. The devices illustrated in FIG. 5 have been simplified for purposes of providing a clearer presentation of the technology. Thus, it is understood that the memory controller 540 and memory 542 illustrated therein will have other circuits and components that are typically used in the read and write operations such as, memory addressing circuits, memory controller control logic circuits, memory core circuits, data and strobe transmitters/drivers, receiver and/or transmit equalization circuits etc. Moreover, the signal bus 544 may include additional data and/or strobe lines as desired depending on the desired data width of the system and the desired strobing implementation.

The strobe signal detector 502 of FIG. 5 is similar to the strobe signal detector 102 of FIG. 1 with respect to the components previously described. Thus, the strobe signal detector 502 will employ receivers 504A and 504B and a state machine circuit 512 with the high threshold signal 506 and the low threshold signal 508 as previously described to generate detector output signals 514A, 514B and 514C. In this embodiment, data receiver 546 and strobe receiver 549 are added. As illustrated, the strobe signal 510 on which the strobe detector 502 operates is also received by the additional strobe receiver 549. This strobe receiver 549 may be implemented with a voltage comparator that utilizes a nominal threshold such as Vref and compares that with the received strobe signal 510. The output of the strobe receiver is then input to an AND gate 548 along with the enable signal (Rx_Enable) as an output signal 514A from the strobe signal detector 502. The signal from the AND gate 548 may then be input as the receive clock signal (Rx_clk) of the data receiver 546. In this way, the strobe signal detector 502 may enable or disable the data receiver 546 to operate in conjunction with detected states of the state machine circuit 512. The delay of the strobe signal introduced by this AND gate 548 can also help to compensate for time delay in the detection of the enabled states of the strobe signal 510 that may result from the use of the logic gates of the state machine circuit 512. Although it is not shown, it will be understood that such data receivers 546 may be implemented with the other data terminals of the system of FIG. 5, which may operate in conjunction with the strobe signal detector 502 or additional such detectors coupled with the other strobe terminals (DQSH and DQSL) of the system, as appropriate.

Figure 6:
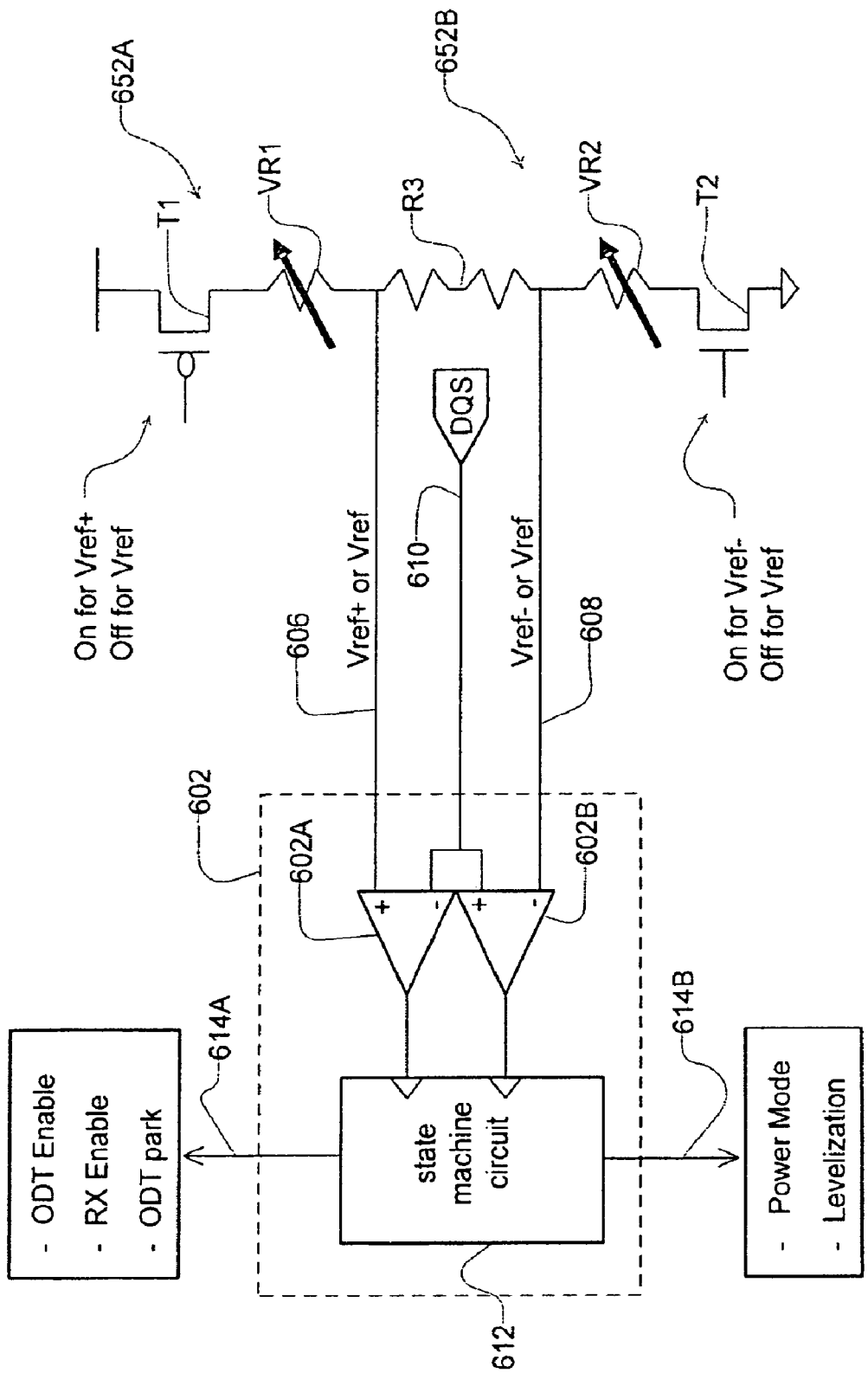
FIG. 6 illustrates an example strobe detector having an adjustable threshold generator.

FIG. 6 shows a still further strobe signal detector 602 embodiment similar to the prior embodiments. However, in this embodiment, the detector employs one or more optional adjustable threshold signal generators 652A and 652B. The adjustable threshold signal generators 652A and 652B are configured for controlling or setting the threshold levels utilized by the receivers 602A and 602B. In the illustrated embodiment, a variable resistor VR1 may be utilized in a voltage divider relationship with resistor R3 to alternatively generate the high threshold signal Vref+ or a lower nominal reference signal Vref that is indicative of an idle level of the strobe signal 610. These settings of the adjustable threshold signal generator 652A may be implemented by setting transistor T1 to its on or off conditions. Similarly, a variable resistor VR2 may be utilized in a voltage divider relationship with resistor R3 to alternatively generate the low threshold signal Vref– or a higher nominal reference signal Vref. These settings of the adjustable threshold signal generator 652B may be implemented by setting transistor T2 to its on or off conditions. With such adjustable threshold generating circuitry, the strobe signal detector 602 may be configured to operate with different combinations of input thresholds. For example, the adjustable threshold signal generators 652A and 652B may be optionally set to generate a nominal threshold Vref to receiver 602A and the low threshold signal 608 to receiver 602B. Based on the different setting possibilities, the receivers 602A and 602B may be suitable for use with strobed data systems based on different thresholding schemes.

A potential benefit of some aspects of the strobe detector technology embodiments described heretofore is in the ability to accurately detect the various edges of the states of the strobe signal in the presence of noise. For example, when a system is in idle mode, the impedance settings of the signal bus may permit noise from other circuit components to oscillate a channel of the signal bus such as the channel associated with strobe signal transmission. In some systems, this noise can cause a strobe receiving circuit to perceive the received noise signal as a strobe signal in a preamble condition. Thus, the noise can cause a false triggering of data receivers and result in erroneous data reception. With the use of the thresholds and related circuits as discussed herein, the strobe signal detector may be less likely to be false triggered by such noise.

Similarly, noise added to a burst state of the strobe signal can suggest an inaccurate oscillation of the strobe signal other than the actual burst pattern in some systems. Thus a receiver of -such systems may improperly sample the data signal associated with the incorrectly interpreted burst pattern and thereby result in data errors. With the use of the thresholds and related circuits as discussed herein, the strobe signal detector may be less likely to be influenced by such noise again resulting in more reliable data reception.

Still other strobe systems may not be able to detect some states of the strobe signal such as the post-amble state or an edge thereof or even a first edge of a burst mode. A method for detecting any or all of these conditions can be an advantage such that it may permit a system to more efficiently switch between transmit and receive modes in accordance with actual states of a monitored strobe signal. This can result in opportunities for power saving and even increased data communication efficiency. Other advantages will be apparent to those skilled in the art upon review of the details of the present description.

In general, each of the circuits implemented in the technology presented herein may be constructed with electrical elements such as traces, capacitors, resistors, transistors, registers, latches etc. that are based on metal oxide semiconductor (MOS) technology, but may also be implemented using other technology such as bipolar technology or any other technology in which a signal-controlled current flow may be achieved.

Furthermore, these circuits may be constructed using automated systems that fabricate integrated circuits. For example, the components and systems described may be designed as one or more integrated circuits, or a portion(s) of an integrated circuit, based on design control instructions for doing so with circuit-forming apparatus that controls the fabrication of the blocks of the integrated circuits. The instructions may be in the form of data stored in, for example, a computer-readable medium such as a magnetic tape or an optical or magnetic disk. The design control instructions typically encode data structures or other information describing the circuitry that can be physically created as the blocks of the integrated circuits. Although any appropriate format may be used for such encoding, such data structures are commonly written in Caltech Intermediate Format (CIF), Calma GDS II Stream Format (GDSII), or Electronic Design Interchange Format (EDIF). Those of skill in the art of integrated circuit design can develop such data structures from schematic and flow diagrams of the type detailed above and the corresponding descriptions and encode the data structures on computer readable medium. Those of skill in the art of integrated circuit fabrication can then use such encoded data to fabricate integrated circuits comprising one or more of the circuits described herein.

In the foregoing description and in the accompanying drawings, specific terminology and drawing symbols are set forth to provide a thorough understanding of the present technology. In some instances, the terminology and symbols may imply specific details that are not required to practice the technology. For example, although "DQS" and "DQ" symbols have been utilized to illustrate example strobe and data signals and these symbols may be associated with DDR systems, such symbols are not intended to limit the technology to any particular type of strobe or data signal or any particular system in which they are implemented.

Moreover, although the technology herein has been described with reference to particular embodiments, it is to be understood that these embodiments are merely illustrative of the principles and applications of the technology. It is therefore to be understood that numerous modifications may be made to the illustrative embodiments and that other arrangements may be devised without departing from the spirit and scope of the technology. For example, although wired signal bus channels are explicitly discussed, wireless channels may also be implemented with the technology such that transmissions may be made between chips using wireless transmitters and receivers that operate by, for example, infrared data signals or electromagnetic data signals sent between the circuit blocks of the technology. Similarly, the channels may be implemented with capacitive, inductive and/or optical principles and can use components for such channels, such as the transmitter and receiver technology capable of transmitting data by such channels. Moreover, although particular strobe patterns have been described, it is understood that other patterns are possible. For example, a preamble state of a strobe signal may begin by a rise of the signal level from an idle level for period of time rather than a drop as previously discussed.

The invention claimed is:

1. An integrated circuit comprising:
a read data receiver for sampling read data in response to a timing signal;
a strobe receiver for receiving a strobe signal accompanying the read data, the strobe signal exhibiting a pattern including a first signal sequence indicating a state prior to data transmission, a second signal sequence indicating a data transmission state, and a third signal sequence indicating a state following data transmission; and gating logic to selectively supply the timing signal upon receipt of the strobe signal based on detection of the first signal sequence.

2. The integrated circuit of claim 1 wherein the gating logic comprises:

a strobe detection circuit to detect the pattern; and an enable circuit coupled to the strobe detection circuit to pass the strobe signal as the timing signal based on detection of the first signal sequence.

3. The integrated circuit of claim 2 wherein the strobe detection circuit comprises:

comparison circuitry having multiple threshold inputs and a strobe signal input for comparison to the threshold inputs, the comparison circuitry to detect the pattern from the comparisons; and a state machine coupled to the comparison circuitry and selectively responsive to the detected pattern data to produce an enable signal for the enable circuit.

4. The integrated circuit of claim 3 wherein the state machine is responsive to detection of threshold comparisons at predetermined times to identify one or more glitch conditions.

5. The integrated circuit of claim 4 wherein the gating logic is responsive to identification of a glitch condition by inhibiting generation of the timing signal based on the received strobe signal.

6. The integrated circuit of claim 3, wherein the comparison circuitry comprises a pair of voltage comparators configured as a window comparator to monitor comparisons of the strobe signal to multiple voltage thresholds.

7. The integrated circuit of claim 3 wherein the gating logic receives the strobe signal, and is responsive to an enable signal to pass the strobe signal as the timing signal, the enable signal generated upon detection of the first signal sequence by the comparison circuitry.

8. The integrated circuit of claim 2 wherein the strobe detection circuit generates an output signal based on the detected pattern to selectively enable the data receiver.

9. The integrated circuit of claim 2 further comprising an on-die-termination circuit, and wherein the strobe detection circuit generates an output signal based on the detected pattern to selectively enable the on-die-termination circuit.

10. The integrated circuit of claim 2 further comprising power mode circuitry, and wherein the strobe detection circuit generates an output signal based on the detected pattern to selectively disable the power mode circuitry.

11. A method of operation in an integrated circuit, the method comprising:

receiving a strobe signal accompanying read data, the strobe signal exhibiting a pattern including a first signal pattern indicating a state prior to data transmission, a second signal pattern indicating a data transmission state, and a third signal pattern indicating a state following data transmission;

selectively supplying a timing signal based on the pattern; and sampling the read data in response to the timing signal.

12. The method of claim 11, wherein selectively supplying comprises:

detecting the first signal sequence of the pattern; and selectively passing the strobe signal as the timing signal based on detection of the first signal sequence.

13. The method of claim 12 and further comprising:

detecting a glitch condition associated with at least one of the signal sequences; and inhibiting passing the strobe signal upon detection of the glitch condition.

14. An integrated circuit comprising:

means for receiving a strobe signal accompanying read data, the strobe signal exhibiting a pattern including a first signal sequence indicating a state prior to data transmission, a second signal sequence indicating a data transmission state, and a third signal sequence indicating a state following data transmission;

means for selectively supplying a timing signal based on detection of the first signal sequence; and means for sampling the read data in response to the timing signal.

15. The integrated circuit of claim 1 embodied as an integrated circuit memory controller.

16. The integrated circuit of claim 10 wherein the power mode circuitry includes circuitry that is periodically in an idle state, and wherein the strobe detection circuit generates an output signal based on the detected pattern to selectively place the power mode circuitry in an active state.

17. The method of operation of claim 11 carried out as a method of operation in a memory controller.

18. The integrated circuit of claim 14 embodied as an integrated circuit memory controller.

* * * * *